(12) United States Patent
Mizukami et al.

(10) Patent No.: US 11,462,508 B2
(45) Date of Patent: Oct. 4, 2022

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Makoto Mizukami, Ibo Hyogo (JP); Tatsuya Hirakawa, Takasago Hyogo (JP); Tomohiro Iguchi, Himeji Hyogo (JP)

(73) Assignees: KABUSHIKI KAISHA TOSHIBA, Tokyo (JP); TOSHIBA ELECTRONIC DEVICES & STORAGE CORPORATION, Tokyo (JP)

(*) Notice: Subject to any disclaimer, the term of this patent is extended or adjusted under 35 U.S.C. 154(b) by 0 days.

(21) Appl. No.: 17/008,378

(22) Filed: Aug. 31, 2020

(65) Prior Publication Data
US 2021/0305204 A1 Sep. 30, 2021

(30) Foreign Application Priority Data
Mar. 24, 2020 (JP) .............................. JP2020-052530

(51) Int. Cl.
*H01L 23/00* (2006.01)

(52) U.S. Cl.
CPC .............. *H01L 24/83* (2013.01); *H01L 24/29* (2013.01); *H01L 24/32* (2013.01); *H01L 24/48* (2013.01); *H01L 2224/29139* (2013.01); *H01L 2224/32245* (2013.01); *H01L 2224/48091* (2013.01); *H01L 2224/83439* (2013.01)

(58) Field of Classification Search
CPC ......... H01L 24/83; H01L 24/29; H01L 24/32; H01L 2224/29139; H01L 2224/32245; H01L 2224/83439
See application file for complete search history.

(56) References Cited

U.S. PATENT DOCUMENTS

| | | | |
|---|---|---|---|
| 7,361,590 B2 | 4/2008 | Kobayashi et al. | |
| 10,046,418 B2 | 8/2018 | Masumori et al. | |
| 2005/0155706 A1* | 7/2005 | Nishida | H01L 23/295 156/312 |
| 2009/0218671 A1* | 9/2009 | Kuwabara | H01L 25/0657 438/109 |
| 2010/0270515 A1* | 10/2010 | Yasuda | H01B 1/22 252/514 |
| 2017/0309783 A1* | 10/2017 | Chen | C30B 29/403 |

FOREIGN PATENT DOCUMENTS

| | | |
|---|---|---|
| JP | 2006202938 A | 8/2006 |
| JP | 5041454 B2 | 10/2012 |
| JP | 6153077 B2 | 6/2017 |

* cited by examiner

*Primary Examiner* — Mohammad M Choudhry
(74) *Attorney, Agent, or Firm* — Kim & Stewart LLP

(57) ABSTRACT

A semiconductor device according to an embodiment includes a semiconductor layer, a metal layer, and a bonding layer provided between the semiconductor layer and the metal layer, the bonding layer including a plurality of silver particles, and the bonding layer including a region containing gold existing between the plurality of silver particles.

8 Claims, 8 Drawing Sheets

SEMICONDUCTOR DEVICE

CROSS-REFERENCE TO RELATED APPLICATION

This application is based upon and claims the benefit of priority from Japanese Patent Application No. 2020-052530, filed on Mar. 24, 2020, the entire contents of which are incorporated herein by reference.

FIELD

Embodiments described herein relate generally to semiconductor devices.

BACKGROUND

In a power semiconductor module, for example, a semiconductor chip is mounted on a metal base with an insulating substrate interposed between the semiconductor chip and the metal base. The semiconductor chip is, for example, a metal oxide field effect transistor (MOSFET), an insulated gate bipolar transistor (IGBT), or a diode.

The semiconductor chip is bonded to, for example, a metal layer on an insulating substrate by using solder as a bonding material. However, as the operating temperature of the power semiconductor module increases, there occurs a problem in the heat resistance of bonding using solder as a bonding material.

A silver nano paste is a candidate for the bonding material that improves the heat resistance of the bonding. The silver nano paste is a paste in which fine silver particles are dispersed in a solvent. The silver nano paste is a paste at room temperature but is changed into a silver thin film by evaporating the solvent by heating. Since the obtained silver thin film has a high melting point, the bonding with high heat resistance can be realized.

DETAILED DESCRIPTION

Figure 1:
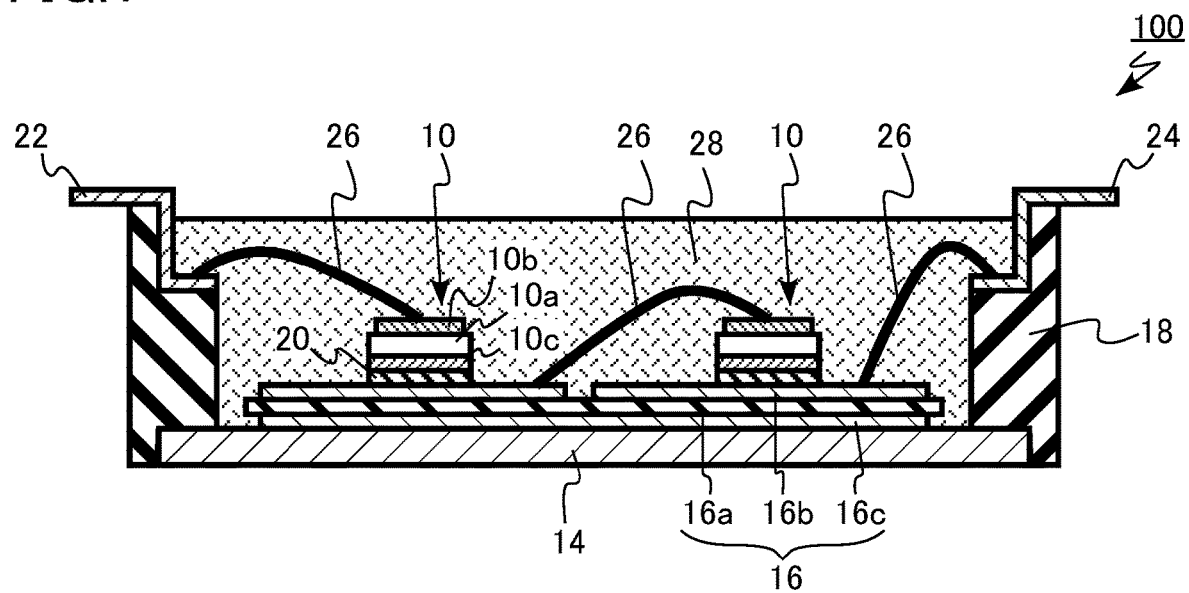
FIG. 1 is a schematic cross-sectional view of a semiconductor device according to an embodiment.

A semiconductor device according to an embodiment includes a semiconductor layer, a metal layer, and a bonding layer provided between the semiconductor layer and the metal layer, the bonding layer including a plurality of silver particles, and the bonding layer including a region containing gold existing between the plurality of silver particles.

In this specification, in some cases, the same or similar members are denoted by the same reference numerals, and duplicate description may be omitted.

In this specification, in some cases, in order to illustrate the positional relationship of parts and the like, the upward direction of the drawings may be referred to as "upper", and the downward direction of the drawings may be referred to as "lower". In this specification, the terms "upper" and "lower" do not necessarily indicate the relationship with the direction of gravity.

Qualitative and quantitative analyses of the chemical composition of the members constituting the semiconductor device in this specification can be performed by, for example, secondary ion mass spectroscopy (SIMS), energy dispersive X-ray spectroscopy (EDX) and a three-dimensional atom probe. In addition, for example, a transmission electron microscope (TEM) and a scanning electron microscope (SEM) can be used to measure the thickness of the members constituting the semiconductor device, the particle diameter of the members, the distance between the members, and the like.

A semiconductor device according to an embodiment includes a semiconductor layer, a metal layer, and a bonding layer being provided between the semiconductor layer and the metal layer and including a plurality of silver particles and regions containing gold existing between the plurality of silver particles.

FIG. 1 is a schematic cross-sectional view of the semiconductor device according to the embodiment.

The semiconductor device according to the embodiment is a power semiconductor module 100. As illustrated in FIG. 1, in the power semiconductor module 100 according to the embodiment, two MOSFETs are connected in series. The power semiconductor module 100 according to the embodiment is a so-called "2 in 1" type module in which a half bridge circuit can be configured with one module. For example, a three-phase inverter circuit can be configured by using three power semiconductor modules 100 according to the embodiment.

The power semiconductor module 100 according to the embodiment includes two MOSFETs 10, a metal base 14, an insulating substrate 16, a resin case 18, a bonding layer 20, a first power terminal 22, a second power terminal 24, a bonding wire 26, and a sealing resin 28. The insulating substrate 16 has a ceramic layer 16a, a front-surface metal layer 16b (metal layer), and a back-surface metal layer 16c.

In addition, the power semiconductor module 100 includes an AC terminal and a gate terminal, which are not illustrated. In addition, the power semiconductor module 100 may include a resin lid (not illustrated) on the sealing resin 28.

The MOSFET 10 has a semiconductor layer 10a, an upper electrode 10b, and a lower electrode 10c. The semiconductor layer 10a is made of, for example, a single crystal silicon carbide (SiC). The upper electrode 10b and the lower electrode 10c are made of metals.

The insulating substrate 16 is provided on the metal base 14. The insulating substrate 16 is provided between the metal base 14 and the MOSFET 10. The insulating substrate 16 has a function of electrically separating the metal base 14 and the MOSFET 10.

The insulating substrate 16 has a ceramic layer 16a, a front-surface metal layer 16b, and a back-surface metal layer 16c. The ceramic layer 16a is provided between the front-surface metal layer 16b and the back-surface metal layer 16c.

The ceramic layer 16a is made of, for example, aluminum oxide, aluminum nitride, or silicon nitride. The front-surface metal layer 16b and the back-surface metal layer 16c are made of, for example, copper.

The bonding layer 20 is provided between the MOSFET 10 and the insulating substrate 16. The bonding layer 20 is provided between the semiconductor layer 10a and the front-surface metal layer 16b. The bonding layer 20 is in contact with the lower electrode 10c and the front-surface metal layer 16b. The bonding layer 20 has a function of fixing the MOSFET 10 and the insulating substrate 16.

Figure 2:
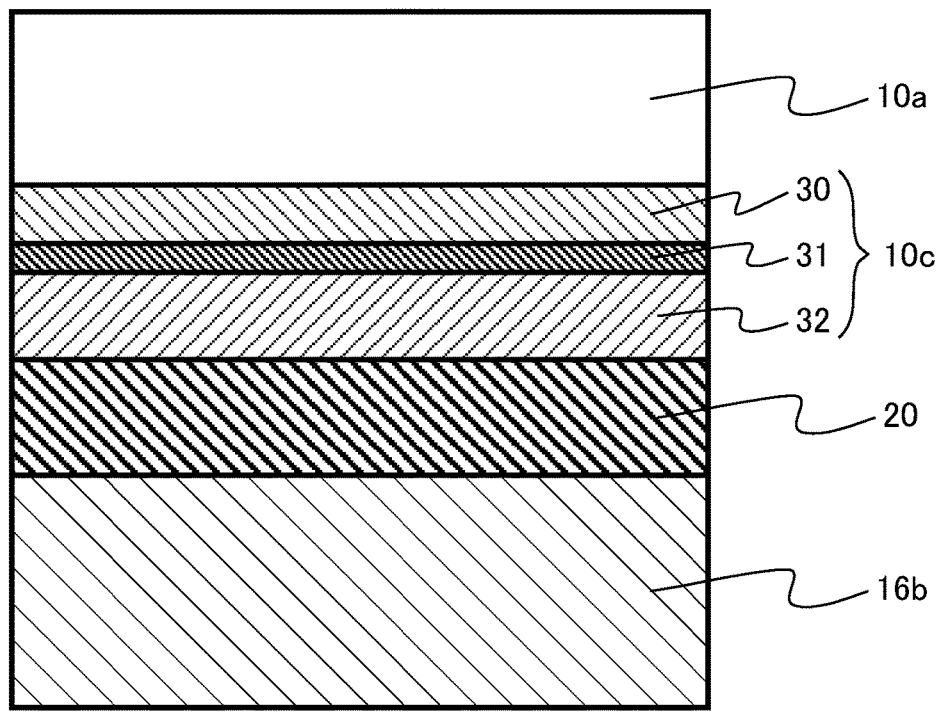
FIG. 2 is an enlarged schematic sectional view of a portion of the semiconductor device according to the embodiment.

FIG. 2 is an enlarged schematic sectional view of a portion of the semiconductor device according to the embodiment. FIG. 2 is an enlarged schematic cross-sectional view of a portion of the MOSFET 10, the bonding layer 20, and the insulating substrate 16. FIG. 2 illustrates the semiconductor layer 10a, the lower electrode 10c, the bonding layer 20, and the front-surface metal layer 16b.

The lower electrode 10c includes a nickel silicide layer 30 (second intermediate layer), a titanium layer 31 (third intermediate layer), and a nickel layer 32 (first intermediate layer). The nickel silicide layer 30 is an example of the second intermediate layer containing nickel silicide. The titanium layer 31 is an example of the third intermediate layer containing titanium. The nickel layer 32 is an example of the first intermediate layer containing nickel.

The nickel layer 32 is provided between the semiconductor layer 10a and the bonding layer 20. The nickel silicide layer 30 is provided between the semiconductor layer 10a and the nickel layer 32. The titanium layer 31 is provided between the nickel layer 32 and the nickel silicide layer 30.

Figure 3:
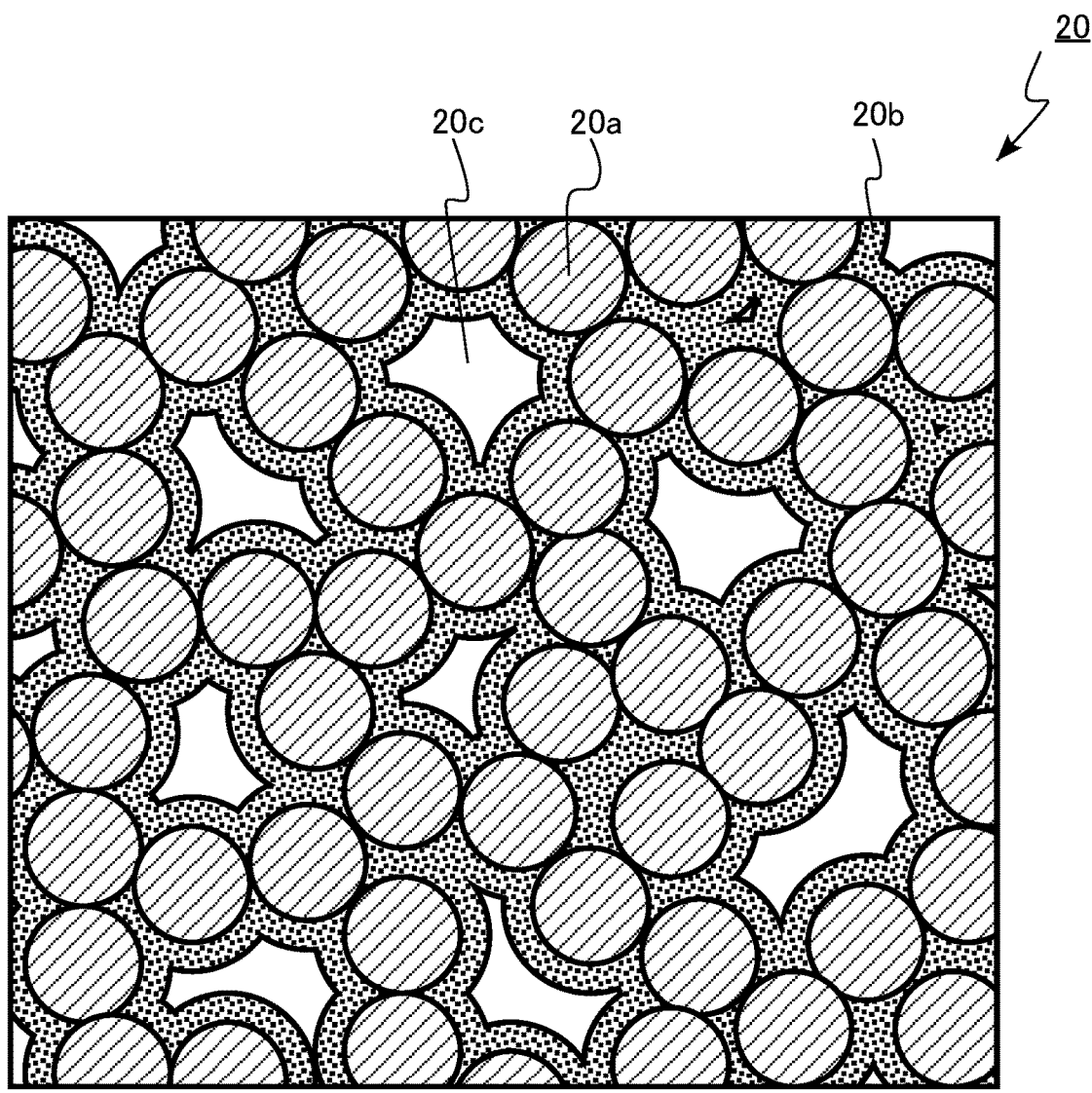
FIG. 3 is an enlarged schematic sectional view of a portion of the semiconductor device according to the embodiment.

FIG. 3 is an enlarged schematic cross-sectional view of a portion of the semiconductor device according to the embodiment. FIG. 3 illustrates the bonding layer 20. The bonding layer 20 includes a plurality of silver particles 20a, gold region 20b (region), and voids 20c. The gold region 20b is an example of a region containing gold.

The silver particles 20a are so-called silver nano particles. At least a portion of the silver particles 20a are in contact with each other. The shape of the silver particle 20a may be spherical. The average particle diameter of the silver particles 20a is, for example, 1 nm or more and 100 nm or less.

The gold region 20b contains gold (Au). The gold region 20b exists between the plurality of silver particles 20a. The gold region 20b covers the plurality of silver particles 20a.

The void 20c is a hole surrounded by the silver particles 20a. The inner wall of the void 20c is covered with the gold region 20b. The gold region 20b covers the inner wall of the void 20c. The gold region 20b is on the inner wall of the void 20c.

The atomic ratio of gold (Au) contained in the bonding layer 20 to the sum of gold (Au) and silver (Ag) contained in the bonding layer 20 (Au/(Au+Ag)) is, for example, 0.5% or more and 20% or less.

Next, an example of a method of manufacturing the semiconductor device according to the embodiment will be described.

FIGS. 4A, 4B, 4C, 4D, and 4E are views illustrating the method of manufacturing the semiconductor device according to the embodiment. FIGS. 4A, 4B, 4C, 4D, and 4E illustrate an example of the method of manufacturing MOSFET 10.

Figure 4A:
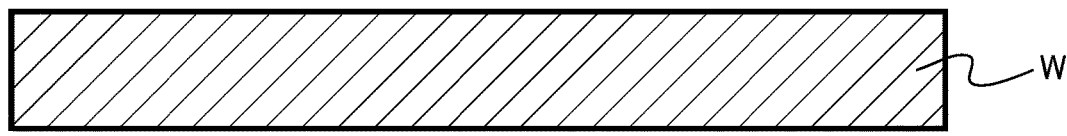
FIGS. 4A, 4B, 4C, 4D, and 4E are views illustrating a method of manufacturing the semiconductor device according to the embodiment.

First, a single crystal silicon carbide wafer W is prepared (FIG. 4A). The thickness of the silicon carbide wafer W is, for example, 200 μm or more and 1000 μm or less.

Figure 4B:
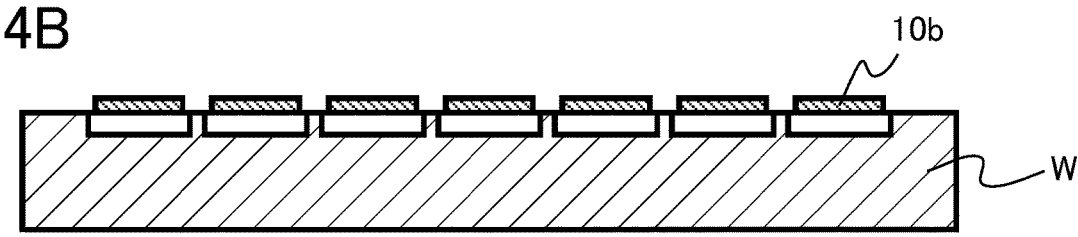

Next, constituent elements of the MOSFET such as the source region, the gate region, and the upper electrode 10b are formed on the front surface of the silicon carbide wafer W by using a known process technique (FIG. 4B). Only the upper electrode 10b is clearly illustrated in FIG. 4B.

Figure 4C:
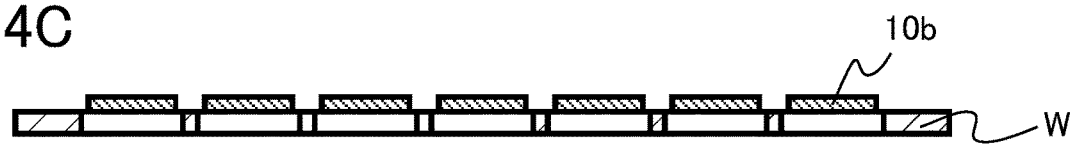

Next, the silicon carbide wafer W is thinned by grinding from the back surface. The silicon carbide wafer W is thinned to, for example, 30 μm or more and 300 μm or less (FIG. 4C). After that, the back surface of the silicon carbide wafer W is planarized by using, for example, a dry polishing method or a chemical mechanical polishing method (CMP method).

Figure 4D:
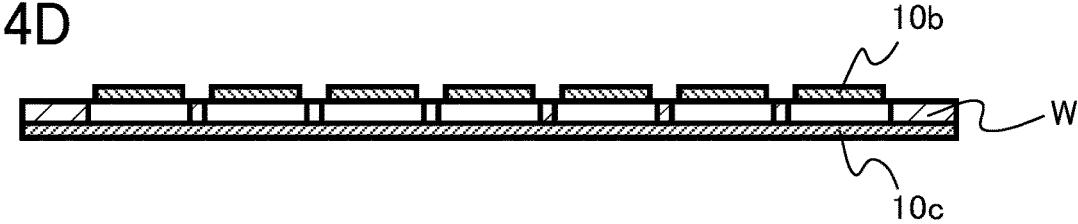

Next, the lower electrode 10c is formed on the back surface of the silicon carbide wafer W (FIG. 4D). Details of forming the lower electrode 10c will be described later.

Figure 4E:
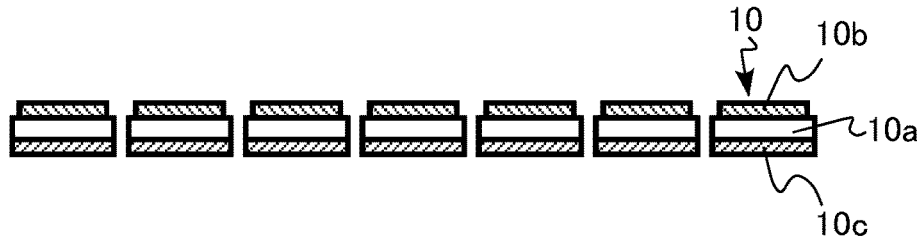

Next, the silicon carbide wafer W is divided by, for example, a blade dicing method to manufacture a plurality of MOSFETs 10 (FIG. 4E).

Figure 5A:
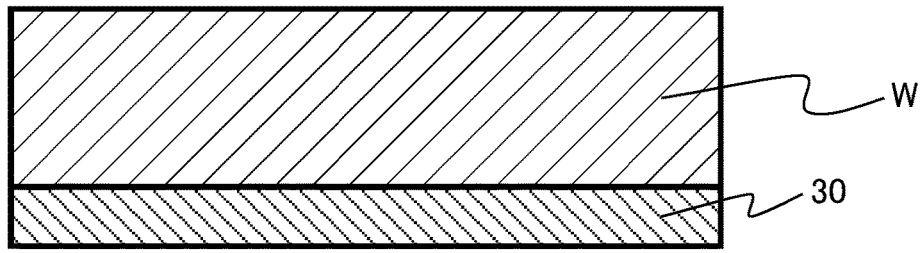
FIGS. 5A, 5B, and 5C are views illustrating a method of manufacturing the semiconductor device according to the embodiment.
Figure 5B:
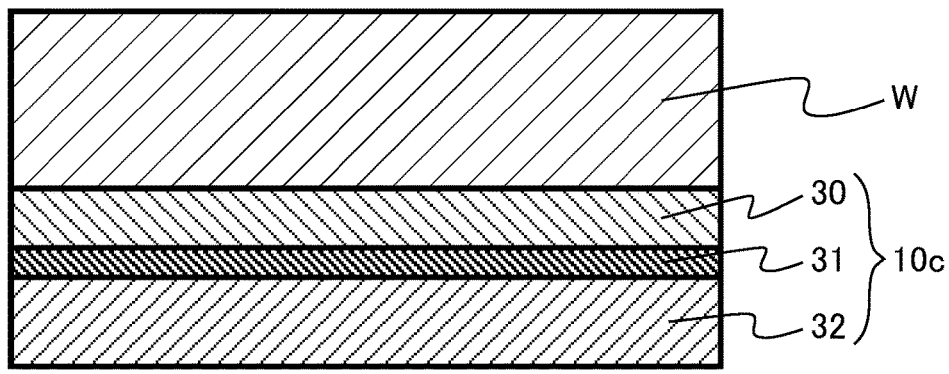
Figure 5C:
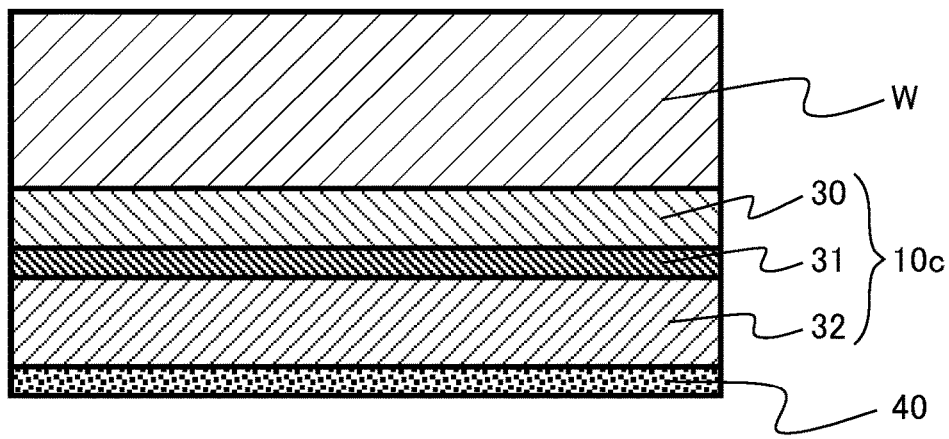

FIGS. 5A, 5B, and 5C are views illustrating the method of manufacturing the semiconductor device according to the embodiment. FIGS. 5A, 5B, and 5C illustrate details of forming the lower electrode 10c.

After the back surface of the silicon carbide wafer W is planarized, a nickel silicide layer 30 is formed on the back surface side of the silicon carbide wafer W (FIG. 5A). The nickel silicide layer 30 is formed by the deposition of a nickel film by the sputtering method and the silicidation reaction between the nickel film and silicon carbide by the heat treatment using laser annealing. By providing the nickel silicide layer 30, the contact between the semiconductor layer 10 and the lower electrode 10c becomes an ohmic contact.

Next, a titanium layer 31 is formed on the nickel silicide layer 30. The titanium layer 31 is formed by a sputtering method. The titanium layer 31 prevents the front surface of the nickel silicide layer 30 from being oxidized.

Next, a nickel layer 32 is formed on the titanium layer 31 (FIG. 5B). The nickel layer 32 is formed by the sputtering method. The nickel layer 32 improves the bondability between the lower electrode 10c and the insulating substrate 16. The nickel layer 32 improves the bonding strength between the lower electrode 10c and the insulating substrate 16. In addition, the nickel layer 32 functions as a diffusion preventing layer of gold, and there is a possibility that gold is slightly diffused into the nickel layer 32. In that case, the atomic concentration of gold in the nickel layer 32 is, for example, lower than the atomic concentration of gold in the bonding layer 20.

Next, a gold layer 40 is formed on the nickel layer (FIG. 5C). The gold layer 40 becomes a supply source of gold that diffuses into the bonding layer 20 later.

Figure 6:
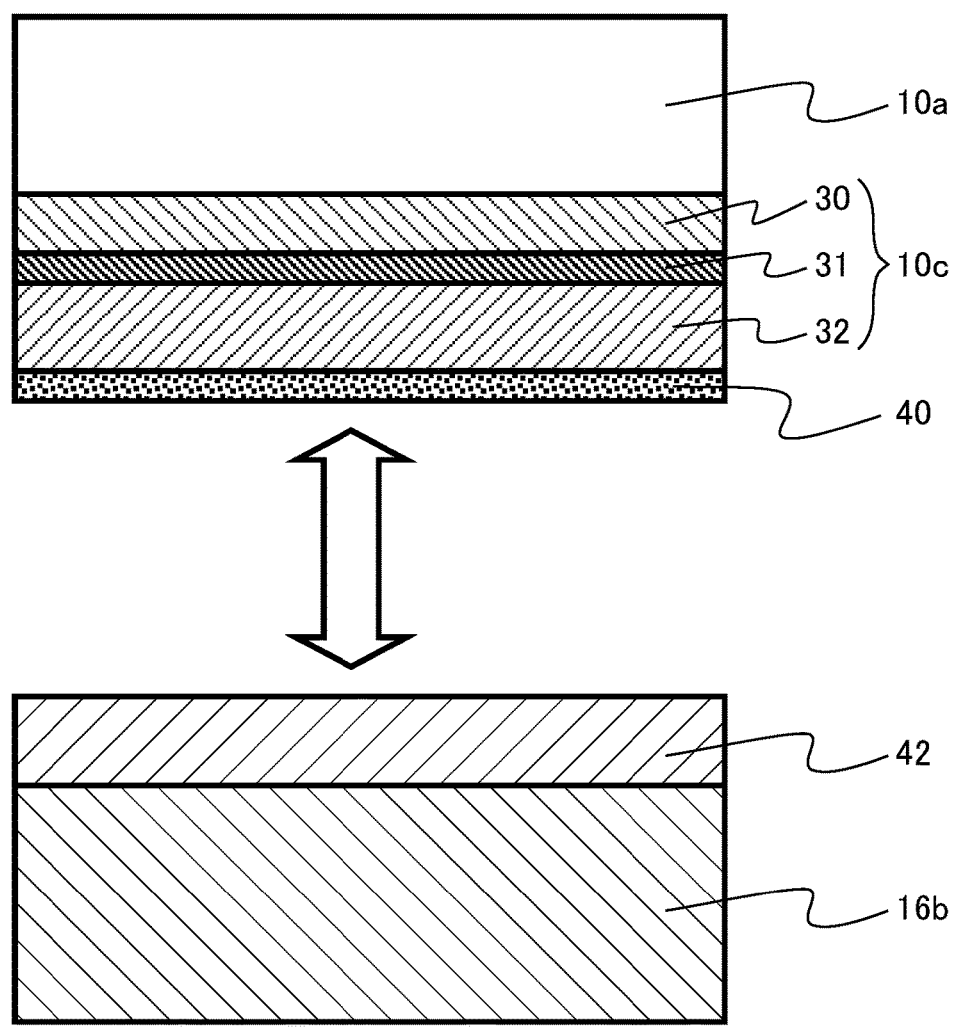
FIG. 6 is a diagram illustrating a method of manufacturing the semiconductor device according to the embodiment.
Figure 7:
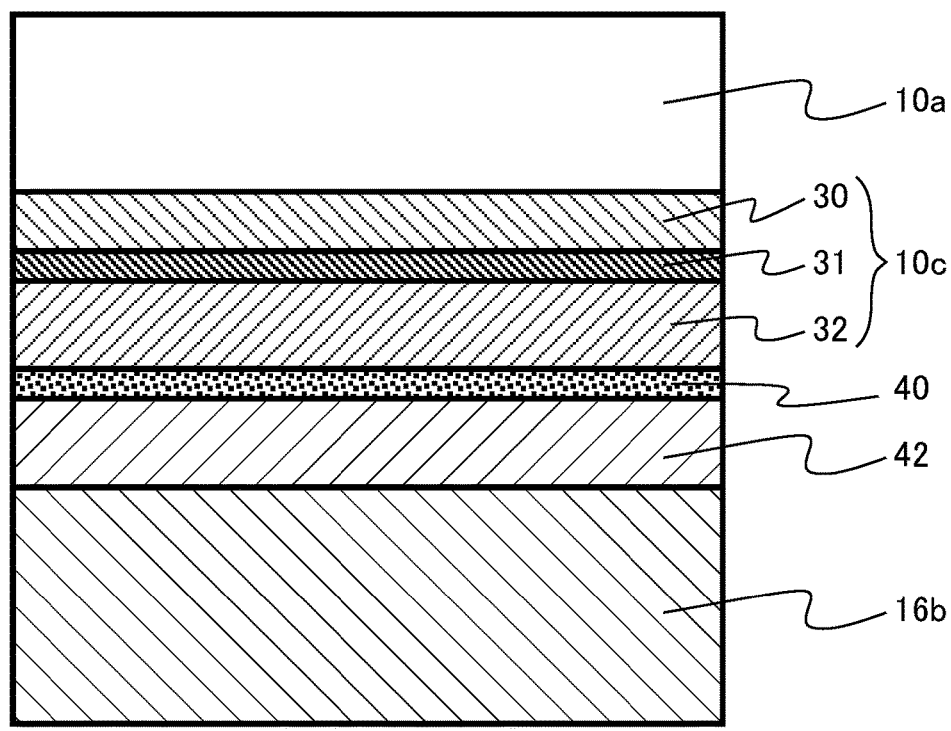
FIG. 7 is a diagram illustrating a method of manufacturing the semiconductor device according to the embodiment.
Figure 8:
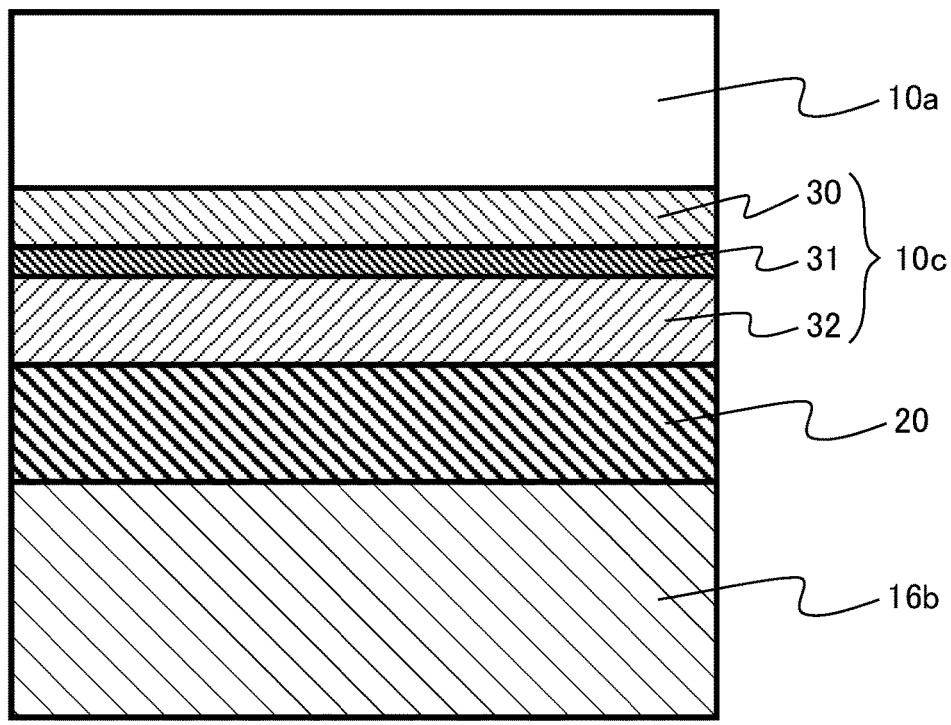
FIG. 8 is a diagram illustrating a method of manufacturing the semiconductor device according to the embodiment.

FIGS. 6, 7 and 8 are diagrams illustrating the method of manufacturing the semiconductor device according to the embodiment. FIG. 6 illustrates details of the formation of the bonding layer 50.

The silver nano paste 42 is applied to the front surface of the front-surface metal layer 16b of the insulating substrate 16 (FIG. 6). The silver nano paste 42 is applied by, for example, a screen printing method.

Next, the insulating substrate 16 and the MOSFET 10 are attached so that the silver nano paste 42 and the gold layer 40 are in contact with each other (FIG. 7). After that, the insulating substrate 16 and the MOSFET 10 are heat-treated while being pressurized. The heat treatment is performed, for example, at 150° C. or more and 300° C. or less.

Due to the heat treatment, the solvent of the silver nano paste 42 is evaporated, and the silver nanoparticles are sintered to form the bonding layer 20 (FIG. 8). During the heat treatment, gold atoms supplied from the gold layer 40 diffuse in the grain boundaries of the silver particles 20*a* to form the gold region 20*b* that covers the silver particles 20*a*.

The gold region 20*b* is, for example, formed substantially uniformly over the entire bonding layer 20. Gold atoms are substantially uniformly dispersed in the bonding layer 20.

After the MOSFET 10 is fixed on the insulating substrate 16 by the bonding layer 20, the power semiconductor module 100 is manufactured by a known manufacturing method.

Next, the function and effect of the semiconductor device according to the embodiment will be described.

Figure 9:
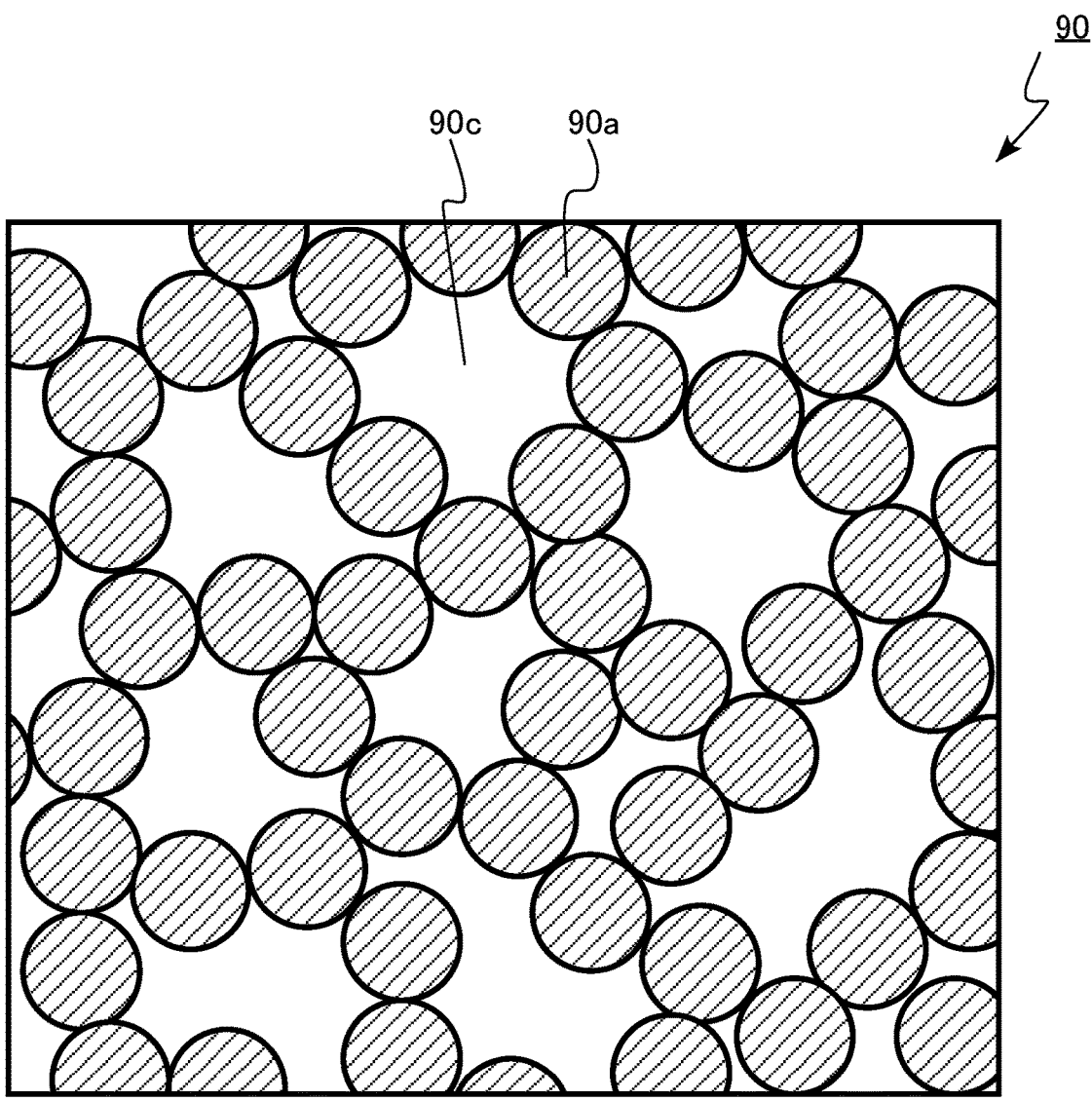
FIG. 9 is an enlarged schematic cross-sectional view of a portion of the semiconductor device according to Comparative Example.

FIG. 9 is an enlarged schematic cross-sectional view of a portion of the semiconductor device according to Comparative Example. The semiconductor device according to Comparative Example is a power semiconductor module similar to the power semiconductor module 100 according to the embodiment.

FIG. 9 illustrates a bonding layer 90 of Comparative Example. The bonding layer 90 includes a plurality of silver particles 90*a* and voids 90*c*. The bonding layer 90 of Comparative Example is different from the bonding layer 20 of the embodiment in that bonding layer 90 of Comparative Example does not include a region containing gold.

When the bonding layer 90 contains the void 90*c*, the inner wall of the void 90*c* becomes reactive. For this reason, the bonding layer 90 is likely to be oxidized or sulfurized. Therefore, the bonding layer 90 is likely to have high resistance, to be embrittled, and to be broken due to repeated temperature changes during operation/non-operation. Therefore, there is a concern that the reliability of the power semiconductor module is reduced.

In addition, in the bonding layer 90, only the portion where the silver particles 90*a* are in contact functions as a current path. For this reason, the current density locally increases, and thus, electromigration easily occurs. Due to the electromigration, the voids 90*c* may be further expanded, and thus, there is a concern that the reliability of the power semiconductor module is reduced.

In the power semiconductor module 100 according to the embodiment, the bonding layer 20 includes the gold region 20*b* existing between the plurality of silver particles 20*a*. The inner wall of the void 20*c* is covered with the gold region 20*b*. Therefore, the reactivity of the inner wall of the void 20*c* becomes poor, and thus, the bonding layer 20 is less likely to be oxidized or sulfurized. Therefore, the bonding layer 20 is less likely to have high resistance, to be embrittled, and to be broken due to repeated temperature changes during operation/non-operation. Therefore, the reliability of the power semiconductor module 100 is improved.

In addition, in the bonding layer 20, not only the portion where the silver particles 20*a* are in contact but also the gold region 20*b* functions as a current path. Therefore, a local increase in current density is unlikely to occur, and thus, the occurrence of the electromigration is suppressed. The expansion of the void 20*c* due to the electromigration is suppressed, and thus, the reliability of the power semiconductor module 100 is improved.

It is considered that the formation of the gold region 20*b* during the heat treatment for forming the bonding layer 20 is related to the formation process of the lower electrode 10*c* on the back surface of the MOSFET 10. That is, it is considered that, the planarizing performed when thinning the back surface of the silicon carbide wafer W and the formation of the nickel silicide layer 30 are performed by laser annealing, and thus the planarization of the front surface of the gold layer 40 before the bonding between the insulating substrate 16 and the MOSFET 10 is maintained high. It is considered that, by maintaining the high planarization, the diffusion of gold atoms into the bonding layer 20 proceeds uniformly, and thus, the gold region 20*b* can be formed substantially uniformly over the entire bonding layer 20. In addition, it is considered that, by providing the nickel layer 32 into which gold atoms are less likely to diffuse on the opposite side of the bonding layer 20, the diffusion of gold into the bonding layer 20 side is also facilitated.

The atomic ratio of gold (Au) contained in the bonding layer 20 to the sum of gold (Au) and silver (Ag) contained in the bonding layer 20 (Au/(Au+Ag)) is, preferably, 0.5% or more and 20% or less. When the atomic ratio is 0.5% or more, high reliability of the power semiconductor module 100 can be realized. In addition, when the atomic ratio is 20% or less, the electrical resistance of the bonding layer 20 becomes low, and thus, the on-resistance of the power semiconductor module 100 is reduced.

As described above, according to the embodiment, by including the gold region 20*b* in the bonding layer 20, the deterioration of the bonding layer 20 is suppressed, and thus, a semiconductor device having a high reliability can be realized.

In the embodiment, a case where the MOSFET is used has been described as an example, but the semiconductor chip to be mounted is not limited to the MOSFET. For example, other transistors or diodes such as IGBT, Schottky barrier diode (SBD), and PIN diode can be applied. In addition, a combination of transistors and diodes can be applied.

In the embodiment, the case where the number of semiconductor chips to be mounted is two has been described as an example, but the number of semiconductor chips may be one or three or more.

In the embodiment, although a case where silicon carbide is used for the semiconductor layer has been described as an example, the semiconductor layer is not limited to a case where silicon carbide is used. For example, other semiconductor materials such as silicon can be applied to the silicon carbide layer.

While certain embodiments have been described, these embodiments have been presented by way of example only, and are not intended to limit the scope of the inventions. Indeed, semiconductor devices described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device further comprising:
   a semiconductor layer;
   a metal layer;
   a bonding layer provided between the semiconductor layer and the metal layer, the bonding layer including a plurality of silver particles and a region containing gold between the plurality of silver particles;
   a first intermediate layer provided between the semiconductor layer and the bonding layer, the first intermediate layer containing nickel; and a second intermediate layer provided between the semiconductor layer and the first intermediate layer, the second intermediate layer containing nickel silicide.

2. The semiconductor device according to claim 1, further comprising a third intermediate layer provided between the first intermediate layer and the second intermediate layer, and the third intermediate layer containing titanium.

3. The semiconductor device according to claim 1, wherein at least a portion of the plurality of silver particles are in contact with each other.

4. The semiconductor device according to claim 1, wherein the region containing gold covers the plurality of silver particles.

5. The semiconductor device according to claim 1, wherein the bonding layer further includes a void, and the region containing gold covers an inner wall of the void.

6. The semiconductor device according to claim 1, wherein an atomic concentration of gold in the first intermediate layer is lower than an atomic concentration of gold in the bonding layer.

7. The semiconductor device according to claim 1, wherein an average particle diameter of the plurality of silver particles is 1 nm or more, and 100 nm or less.

8. The semiconductor device according to claim 1, wherein an atomic ratio of gold (Au) contained in the bonding layer to a sum of gold (Au) and silver (Ag) contained in the bonding layer (Au/(Au+Ag)) is 0.5% or more, and 20% or less.

* * * * *

UNITED STATES PATENT AND TRADEMARK OFFICE
CERTIFICATE OF CORRECTION

| | | |
|---|---|---|
| PATENT NO. | : 11,462,508 B2 | Page 1 of 1 |
| APPLICATION NO. | : 17/008378 | |
| DATED | : October 4, 2022 | |
| INVENTOR(S) | : Makoto Mizukami et al. | |

It is certified that error appears in the above-identified patent and that said Letters Patent is hereby corrected as shown below:

In the Claims

Column 6, Line 58, delete "further".

Signed and Sealed this
Twenty-fourth Day of October, 2023

Katherine Kelly Vidal
*Director of the United States Patent and Trademark Office*